United States Patent
Han et al.

(10) Patent No.: US 8,184,228 B2
(45) Date of Patent: May 22, 2012

(54) DISPLAY DEVICE AND METHOD OF COMPENSATING FOR PRESSURE CHANGES THEREOF

(75) Inventors: Sang-Ho Han, Incheon (KR);
Jeong-Geun Yoo, Yongin-si (KR);
Jae-Myung Jang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 739 days.

(21) Appl. No.: 12/032,132

(22) Filed: Feb. 15, 2008

(65) Prior Publication Data

US 2008/0210843 A1 Sep. 4, 2008

(30) Foreign Application Priority Data

Mar. 2, 2007 (KR) ........................ 10-2007-0020808

(51) Int. Cl.
*G02F 1/1333* (2006.01)
*G06F 3/041* (2006.01)

(52) U.S. Cl. .............................. 349/58; 349/60; 345/173

(58) Field of Classification Search .................. None
See application file for complete search history.

(56) References Cited

U.S. PATENT DOCUMENTS

| | | | | |
|---|---|---|---|---|
| 6,532,152 B1* | 3/2003 | White et al. | | 361/692 |
| 6,871,979 B2* | 3/2005 | Mai | | 362/241 |
| 7,059,757 B2* | 6/2006 | Shimizu | | 362/561 |
| 7,070,427 B2* | 7/2006 | Liao et al. | | 439/135 |
| 7,234,834 B2* | 6/2007 | Lai et al. | | 362/218 |
| 2005/0057946 A1* | 3/2005 | Kim | | 362/561 |
| 2007/0017685 A1* | 1/2007 | Moore et al. | | 174/17 VA |
| 2008/0068342 A1* | 3/2008 | Chang et al. | | 345/173 |
| 2009/0284683 A1* | 11/2009 | Usukura et al. | | 349/62 |

FOREIGN PATENT DOCUMENTS

| | | | | |
|---|---|---|---|---|
| JP | 10214031 | | 8/1998 |
| JP | 2005062777 | | 3/2005 |
| JP | 2005062777 A | * | 3/2005 |
| JP | 2006064840 | | 3/2006 |
| KR | 2008019384 A | * | 3/2008 |

* cited by examiner

*Primary Examiner* — Michelle R Connelly Cushwa
(74) *Attorney, Agent, or Firm* — Cantor Colburn LLP (57) ABSTRACT

A display device includes a display panel, a touch screen panel and a receiving container. The display panel displays an image. The touch screen panel is spaced apart from the display panel. The receiving container receives the display panel and has a venting part facing a side surface of the display panel to reduce a pressure difference between a pressure in a space between the display panel and the touch screen panel of the display device and a pressure exterior to the display device.

15 Claims, 7 Drawing Sheets

DISPLAY DEVICE AND METHOD OF COMPENSATING FOR PRESSURE CHANGES THEREOF

This application claims priority to Korean Patent Application No. 2007-20808, filed on Mar. 2, 2007, and all the benefits accruing therefrom under 35 U.S.C. §119, the contents of which in its entirety are herein incorporated by reference.

BACKGROUND OF THE INVENTION

1. Field of the Invention

The present invention relates to a display device and a method of compensating for pressure changes of the display device. More particularly, the present invention relates to a display device having a touch screen panel and a method of compensating for pressure changes of the display device, thereby effectively eliminating or substantially decreasing defects of the display device.

2. Description of the Related Art

A flat panel display device uses an electric signal to display an image for a user. The flat panel display device has various desirable characteristics, such as being thin, lightweight and small sized, for example, and is thus widely used in various fields.

In order to directly input information to the flat panel display device in real time, the flat panel display device may include a touch screen panel. The touch screen panel senses pressure or light, for example, which is applied to the touch screen panel by an object disposed on the touch screen panel and generates a position signal corresponding to a position of the object on the touch screen panel.

When the touch screen panel is disposed on a display panel of the flat panel display device, the touch screen panel may make contact with the display panel due to a pressure difference between an interior space and an exterior space of the flat panel display device. As a result, a water mark forms on the flat panel display device.

In addition, particles flow into a space between the touch screen panel and the display panel, thereby deteriorating an image display quality of the flat panel display device.

BRIEF SUMMARY OF THE INVENTION

Exemplary embodiments of the present invention provide a display device having an improved image display quality.

In addition, exemplary embodiments of the present invention provide a method of compensating for pressure changes of the display device to effectively eliminate or substantially decrease defects thereof.

A display device in accordance with one exemplary embodiment of the present invention includes a display panel, a touch screen panel disposed above the display panel and a receiving container. The display panel displays an image. The receiving container receives the display panel and has a venting part facing a side surface of the display panel to adjust the pressure of a space between the display panel and the touch screen panel.

The receiving container includes a mold frame which supports the display panel.

The venting part has an air hole formed through the mold frame, the air hole extending from an inner side surface to an outer side surface of the mold frame.

The air hole may have a zigzag shape or the air hole may have a serpentine shape.

The venting part has an air hole formed through the mold frame, the air hole extending from the inner side surface toward a lower bottom surface of the mold frame.

The air hole includes: a first straight portion extending from an opening at the inner side surface of the mold frame in a first direction substantially toward an outer side surface of the mold frame; a first bent portion connecting the first straight portion to a second straight portion, the second straight portion extending from the first bent portion in a second direction substantially perpendicular to the first direction downward toward the bottom surface of the mold frame; a second bent portion connecting the second straight portion to a third straight portion, the third straight portion extending from the second bent portion in the first direction; a third bent portion connecting the third straight portion to a fourth straight portion, the fourth straight portion extending from the third bent portion in the second direction; a fourth bent portion connecting the fourth straight portion to a fifth straight portion, the fifth straight portion extending from the fourth bent portion in a third direction substantially opposite to the first direction; and a fifth bent portion connecting the fifth straight portion to a sixth straight portion, the sixth straight portion extending from the fifth bent portion in the second direction to an opening at the bottom surface of the mold frame.

The venting part includes an expansion space formed in the mold frame, a first air hole formed from the expansion space to an outer side surface of the mold frame and a second air hole formed from the expansion space to an inner side surface of the mold frame.

A width of the expansion space is greater than a width of the first air hole and a width of the second air hole.

The venting part further includes a plurality of first air holes, and may further comprise a porous venting portion formed through the mold frame from an inner side surface of the mold frame to an outer side surface of the mold frame.

The porous venting part includes a foam resin or a porous fabric.

The receiving container may further include a mold frame which supports the display panel, a chassis member on the mold frame to support the touch screen panel, a first adhesive member interposed between the mold frame and the chassis member and a second adhesive member interposed between the chassis member and the touch screen panel.

The venting part includes an air hole formed through the first adhesive member between the mold frame and the chassis member.

The display device may further include a backlight assembly disposed under the display panel to supply the display panel with light and a bottom chassis combined with the receiving container to receive the backlight assembly.

A method of compensating for pressure changes of a display apparatus in accordance with another exemplary embodiment of the present invention is provided as follows. Air is injected into a space between a chassis member and an outer surface of a mold frame. The air on the outer surface of the mold frame is injected into an expansion space through a first air hole having a smaller width than a width of the expansion space. The air in the expansion space is injected into the interior of the mold frame through a second air hole having a smaller width than the expansion space. The air in the interior of the mold frame is injected into a space between a display panel and a touch screen panel to increase the pressure of the space between the display panel and the touch screen panel.

The air may be injected into the expansion space through a plurality of first air holes.

A pressure of the air in the expansion space is greater than a pressure of the air in the first air hole and the second air hole.

In yet another exemplary embodiment of the present invention, a method of compensating for pressure changes of a display device having a first air hole, a second air hole and an expansion space includes: injecting air from a space between a display panel and a touch screen panel of the display device into the second air hole, the second air hole having a width less than a width of the expansion space; injecting the air in the second air hole into the expansion space; injecting the air in the expansion space into the first air hole, the first air hole having a width less than the width of the expansion space; and injecting the air in the first air hole into a space between the chassis member and an outer surface of a mold frame to decrease a pressure of the space between the display panel and the touch screen panel of the display device.

The air is injected into the space between the chassis member and the outer surface of the mold frame through a plurality of first air holes.

A pressure of the air in the expansion space is greater than a pressure of the air in the first air hole and the second air hole.

According to the display device and the method of compensating for pressure changes of the display device of the present invention, the receiving container includes the venting part to compensate for a pressure difference between the exterior and the interior of the space between the display panel and the touch screen panel, thereby effectively eliminating or substantially decreasing defects of the display device. In addition, the particles are prevented from flowing into the space between the display panel and the touch screen panel.

BRIEF DESCRIPTION OF THE DRAWINGS

The above and other aspects, features and advantages of the present invention will become more apparent by describing in further detail exemplary embodiments thereof with reference to the accompanying drawings, in which.

DETAILED DESCRIPTION OF THE INVENTION

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, the present invention will be described in further detail with reference to the accompanying drawings.

Figure 1:
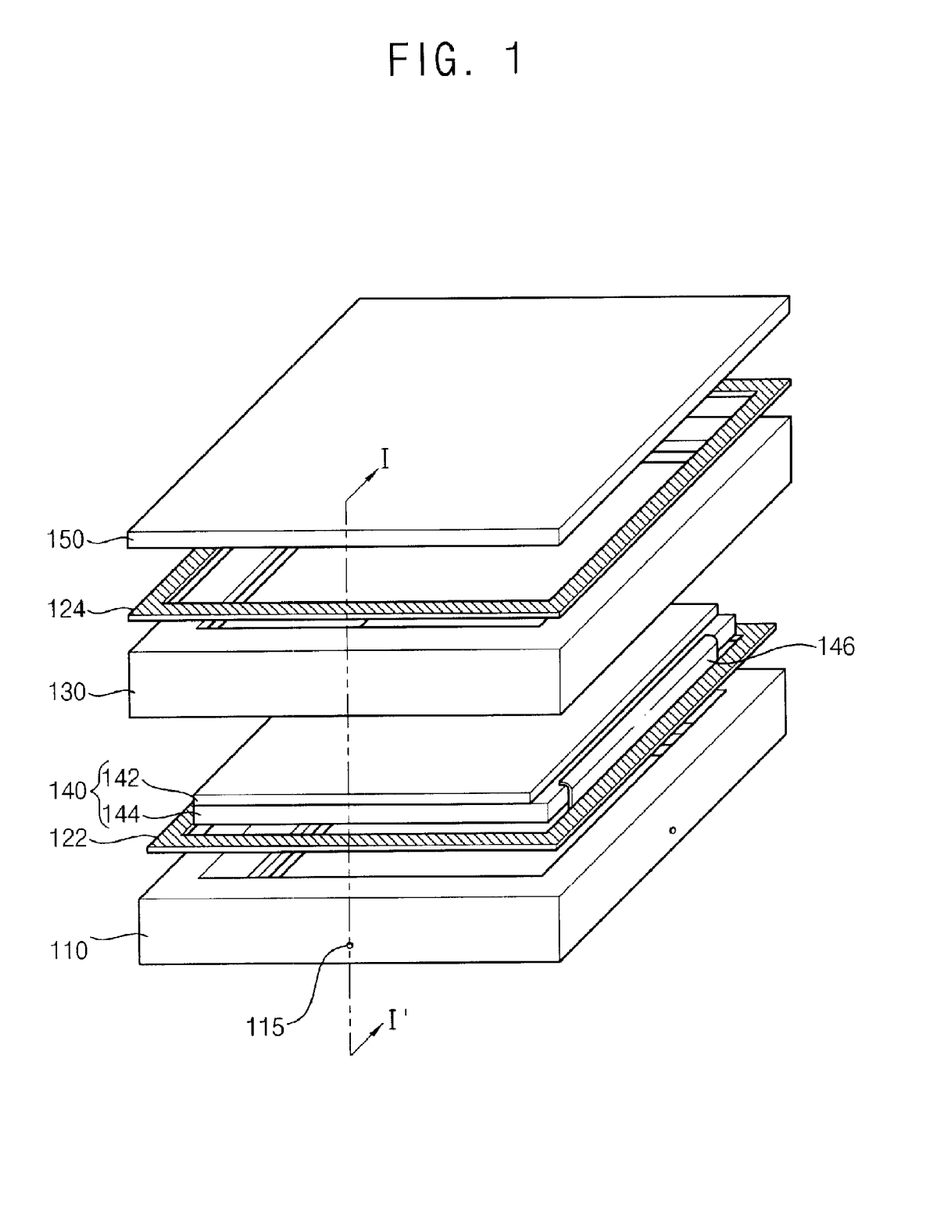
FIG. 1 is an exploded perspective view of a display device in accordance with a first exemplary embodiment of the present invention.
Figure 2:
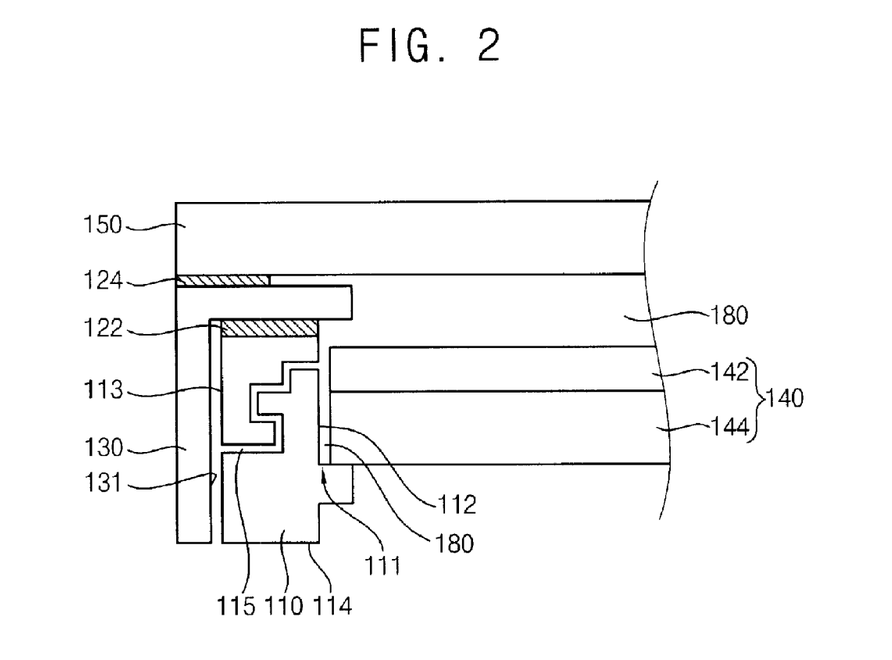
FIG. 2 is a partial cross-sectional view taken along line I-I' of the display device in accordance with the first exemplary embodiment of the present invention shown in FIG. 1.

FIG. 1 is an exploded perspective view of a display device in accordance with a first exemplary embodiment of the present invention. FIG. 2 is a cross-sectional view taken along line I-I' of the display device in accordance with the first exemplary embodiment of the present invention shown in FIG. 1.

Referring to FIGS. 1 and 2, the display device includes a display panel 140, a touch screen panel 150, a mold frame 110, a chassis member 130, a first adhesive member 122 and a second adhesive member 124.

The display panel 140 displays an image based on an image signal received via a flexible circuit board 146. In FIGS. 1 and 2, the display panel 140 includes a display substrate 144, an opposite substrate 142 facing the display substrate 144 and a liquid crystal layer (not shown) interposed between the display substrate 144 and the opposite substrate 142. Alternatively, the display panel 140 may include an organic light-emitting display ("OLED") panel, an electrophoretic display panel or a plasma display panel ("PDP"), for example, but is not limited thereto.

The touch screen panel 150 is disposed above the display panel 140, as shown in FIG. 2. In the first exemplary embodiment of the present invention, the touch screen panel 150 includes a plurality of pressure sensors (not shown) to detect a position on which external pressure is applied onto the touch screen panel 150. In alternative exemplary embodiments, the touch screen panel 150 may include a plurality of photo sensors (not shown), for example, but is not limited thereto.

The mold frame 110 receives the display panel 140. As shown in FIGS. 1 and 2, an inner surface 112 of the mold frame 110 faces a side of the display panel 140 and has an inner protrusion 111 to support a bottom peripheral portion of the display panel 140.

The inner surface 112 of the mold frame 110 faces the side of the display panel 140 such that an air hole 115 formed through the inner surface 112 and an outer surface 113 of the mold frame 110 allows air to flow into an inner space 180 of the display device between the inner surface 112 of the mold frame 110 and the side of the display panel 140.

The mold frame 110 includes an insulating material (not shown), which electrically insulates the display panel 140 from the chassis member 130.

The air may flow into the inner space 180 of the display device through the air hole 115, or may flow out of the inner space 180 of the display device through the air hole 115 toward an exterior of the display device. Thus, a pressure difference between the inner space 180 of the display device and the exterior of the display device decreases so that a pressure in the inner space 180 of the display device is substantially equal to a pressure of the exterior of the display device.

In an alternative exemplary embodiment of the present invention, the mold frame 110 may have a plurality of air holes 115.

As shown in FIG. 2, the air hole 115 has a zigzag, e.g., a nonlinear, shape. In contrast, if the air hole has a linear shape, particles (not shown) flow into the inner space 180 of the mold frame 110 through the air hole 115. However, the zigzag shape of the air hole 115 according to the first exemplary embodiment of the present invention increases a length of a path through which the air passes, thereby preventing the particles from flowing into the inner space of the mold frame 110.

In alternative exemplary embodiments of the present invention, the air hole 115 may be formed through a lower surface 114 of the mold frame 110. For example, the outer side surface 113 and the lower surface 114 may form an outer surface of the mold frame 110.

Referring again to FIG. 2, the air hole 115 has the zigzag shape when viewed on a plane substantially perpendicular to a longitudinal axis of the display panel 140. Alternatively, the air hole 115 may have a zigzag shape when viewed on a plane substantially parallel with the longitudinal axis the display panel 140, for example, but is not limited thereto.

Still referring to FIG. 2, the chassis member 130 is disposed on the mold frame 110, and covers the outer side surface 113 of the mold frame 110. The chassis member 130 includes an opening (not shown) through which a display region of the display panel 140 is exposed. The chassis member 130 is attached to the mold frame 130 with the first adhesive member 122.

An inner surface 131 of the chassis member 130 faces the outer side surface 113 of the mold frame 110, such that the air hole 115 allows the air to flow between the inner space 180 and the exterior of the display device, as described above. In FIGS. 1 and 2, the chassis member 130 includes metal, for example, and the first adhesive member 122 includes a double-sided adhesive tape, for example, but neither is limited thereto in alternative exemplary embodiments of the present invention.

The second adhesive member 124 is disposed between the touch screen panel 150 and the chassis member 130 so that the touch screen panel 150 is attached to the chassis member 130, as shown in FIG. 2.

As described above, in the display device according to the first exemplary embodiment of the present invention shown in FIGS. 1 and 2, the inner space 180 of the display device is connected to the exterior of the display device through the air hole 115 so that the pressure in the inner space 180 of the display device is substantially equal to the pressure of the exterior of the display device. Thus, the touch screen panel 150 is not bent toward the display panel 140 by a pressure difference between the inner space 180 of the display device and the exterior of the display device, thereby improving an image display quality of the display device.

In addition, the air hole 115 has the zigzag shape, so that the particles do not flow into the space between the display panel 140 and the touch screen panel 150 through the air hole 115, further improving the image display quality of the display device.

Figure 3:
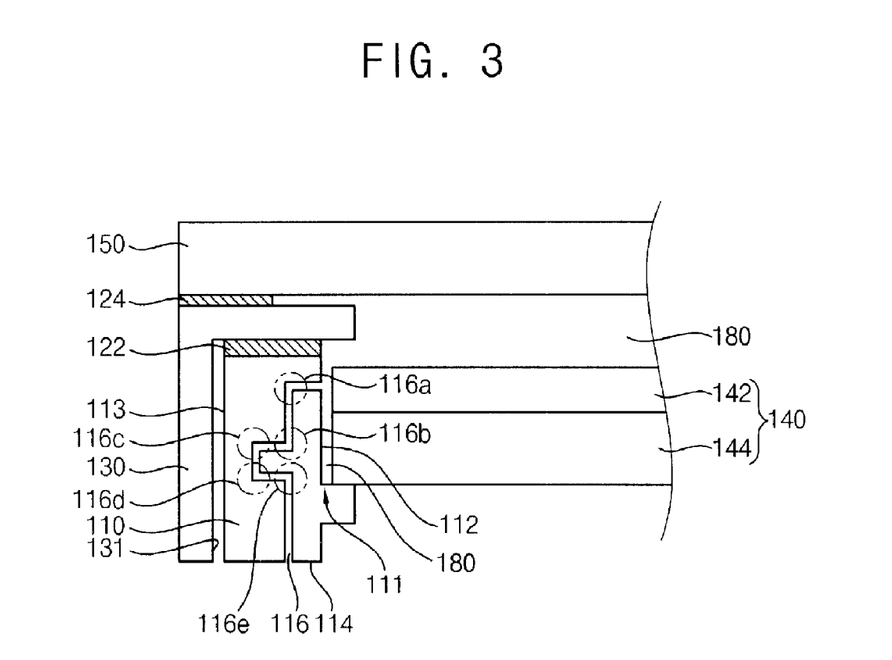
FIG. 3 is a partial cross-sectional view of a display device in accordance with a second exemplary embodiment of the present invention.

FIG. 3 is a partial cross-sectional view of a display device in accordance with a second exemplary embodiment of the present invention. The display device of FIG. 3 is substantially the same as in FIGS. 1 and 2 except for an air hole in a mold frame. Thus, the same reference numerals will be used to refer to the same or like parts as those described in FIGS. 1 and 2 and any repetitive explanation concerning the same or like parts will be omitted below.

Referring to FIG. 3, a mold frame 110 has an air hole 116 formed through an inner surface 112 and a lower surface 114 of the mold frame 110.

The air hole 116 has a zigzag shape, and includes a plurality of bent portions which are each bent in a transverse direction and/or a longitudinal direction of the mold frame 110. In FIG. 3, for example, the air hole 116 includes a first bent portion 116a, a second bent portion 116b, a third bent portion 116c, a fourth bent portion 116d and a fifth bent portion 116e, but is not limited thereto.

Further referring to FIG. 3, the air hole 116 opens at the inner surface 112 of the mold frame 110 and extends toward an outer side surface 113 of the mold frame 110. The air hole 116 extended toward the outer side surface 113 of the mold frame 110 is then bent at the first bent portion 116a toward the lower surface 114 of the mold frame 110.

The air hole 116 extended toward the lower surface 114 of the mold frame 110 is then bent at the second bent portion 116b toward the outer side surface 113 of the mold frame 110.

The air hole 116 extended toward the outer side surface 113 of the mold frame 110 is then bent at the third bent portion 116c toward the lower surface 114 of the mold frame 110.

The air hole 116 extended toward the lower surface 114 of the mold frame 110 is then bent at the fourth bent portion 116d toward the inner surface 112 of the mold frame 110.

Finally, the air hole 116 extended toward the inner surface 112 of the mold frame 110 is then bent at the fifth bent portion 116d toward the lower surface 114 of the mold frame 110. The air hole 116 extended toward the lower surface 114 of the mold frame 110 is then opened through the lower surface 114, as shown in FIG. 3.

Thus, as described above, in the display device according to the second alternative exemplary embodiment of the present invention in FIG. 3, the air hole 116 has the first, second, third, fourth and fifth bent portions 116a, 116b, 116c, 116d and 116e, respectively, which form the zigzag shape opened at the inner surface 112 of the mold frame 110 toward the lower surface 114 of the mold frame 110.

Figure 4:
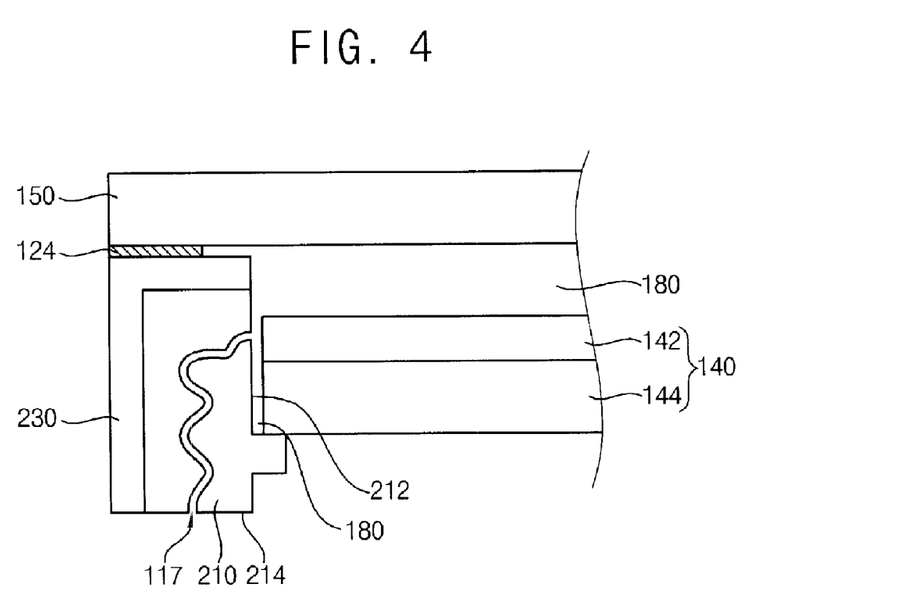
FIG. 4 is a partial cross-sectional view of a display device in accordance with a third exemplary embodiment of the present invention.

FIG. 4 is a partial cross-sectional view of a display device in accordance with a third exemplary embodiment of the present invention. The display device of FIG. 4 is substantially the same as in FIGS. 1 and 3 except for a chassis member and a mold frame. Thus, the same reference numerals will be used to refer to the same or like parts as those described in FIGS. 1 and 3 and any repetitive explanation concerning the same or like parts will be omitted below.

Referring to FIG. 4, the mold frame 210 is integrally formed with the chassis member 230, e.g., without using a first adhesive (not shown). For example, the mold frame 210 may be formed through a molding process using the mold frame 210 as a cast, but is not limited thereto. Thus, an outer side surface of the mold frame 210 makes contact with an inner surface of the chassis member 230, as shown in FIG. 4.

An air hole 117 is formed through the mold frame 210 from an inner surface 212 toward a lower surface 214 of the mold frame 210, so that external air may pass through the air hole 117 toward an inner space 180 between a display panel 140 and a touch screen panel 150. In FIG. 4, the air hole 117 has a serpentine shape from an inner surface 212 toward a lower surface 214 of the mold frame 210.

In the display device according to the third exemplary embodiment of the present invention in FIG. 4, the mold frame 210 is integrally formed with the chassis member 230, so that the display device may be more easily fabricated and manufacturing costs thereof are thereby effectively reduced.

In addition, the length of the air hole 117 is increased so that particles (not shown) will not flow into the inner space 180 of the display device.

Figure 5:
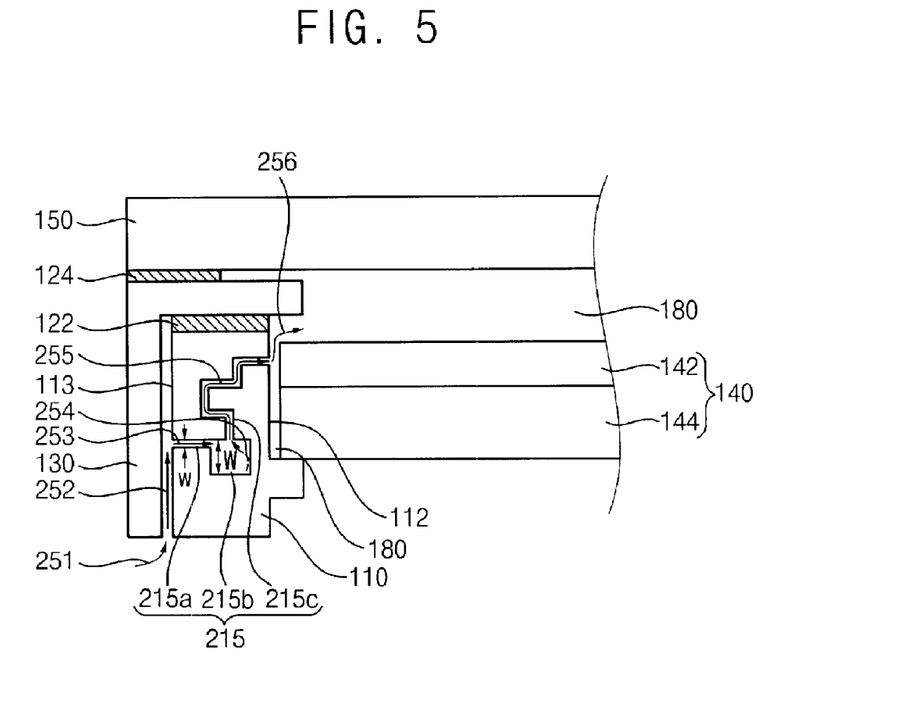
FIG. 5 is a partial cross-sectional view illustrating a method of compensating for pressure changes of a display device in accordance with a fourth exemplary embodiment of the present invention.

FIG. 5 is a partial cross-sectional view illustrating a method of compensating for pressure changes of a display device in accordance with a fourth exemplary embodiment of the present invention. The display device of FIG. 5 is substantially the same as in FIGS. 1 and 2 except for an air hole. Thus, the same reference numerals will be used to refer to the same or like parts as those described in FIGS. 1 and 2 and any repetitive explanation concerning the same or like parts will be omitted below.

Referring to FIG. 5, an air hole 215 passes through a mold frame 110 from an inner surface 112 toward an outer side surface 113 of the mold frame 110. The air hole 215 has a first air hole 215a, a second air hole 215c and an expansion space 215b.

The first air hole 215a connects the outer side surface 113 of the mold frame 110 with the expansion space 215b. The second air hole 215c connects the inner surface 112 of the mold frame 110 with the expansion space 215b.

Further, the expansion space 215b is formed in the mold frame 110. The expansion space 215b is connected to the exterior of the mold frame 110 through the first air hole 215a, as shown in FIG. 5.

When a pressure in an inner space 180 decreases, air 251 which is provided from an exterior of the display device flows into a space between the chassis member 130 and the mold frame 110, becoming air 252.

The air 252 between the chassis member 130 and the mold frame 110 is then injected into the first air hole 215a of the mold frame 110, becoming air 253.

The air 253 in the first air hole 215a is injected into the expansion space 215b, becoming air 254.

When a fixed amount of the air 254 passes first through the first air hole 215a, then through the expansion space 215b having a width W greater than a width w of the first air hole 215a and the second air hole 215c, and then through the second air hole 215c to become air 255, a velocity of the air 254 in the expansion space 215b is smaller than a velocity of the air 253 in the first air hole 215a or a velocity of the air 255 in the second air hole 215c.

Although not intending to be bound by theory, a function of the expansion space 215b will be explained with reference to Bernoulli's Theorem. A pressure level Pb of the air 254 in the expansion space 215b and a pressure level Pa of the air 253 and the air 255 in the first and second air holes 215a and 215c, respectively, are represented by Equation 1 of Bernoulli's Theorem.

$$Pa + 1/2\rho Va^2 + \rho g Ha = Pb + 1/2\rho Vb^2 + \rho g Hb \tag{1}$$

where Ha represents heights of particles in the first and second air holes 215a and 215c; Hb represents heights of particles in the expansion space 215b; Pa and Pb represent pressure levels of the air 253 and the air 255 in the first and second air holes 215a and 215c and the air 254 in the expansion space 215b, respectively; Va and Vb represent velocities of the air 253 and the air 255 in the first and second air holes 215a and 215c and the air 254 in the expansion space 215b, respectively; and ρ and g represent a density of air and gravitational acceleration, respectively.

When the velocity Vb of the air 254 in the expansion space 215b is less than the velocity Va of the air 253 and the air 254 in the first and second air holes 215a and 215c, respectively, the pressure Pb of the air 254 in the expansion space 215b is higher than the pressure Pa of the air 253 and the air 255 in the first and second air holes 215a and 215c. Thus, particles are trapped in the expansion space 215b instead of flowing into the inner space 180.

After the particles are trapped in the expansion space 215b, the air 254 without the particles is injected into the second air hole 215c, becoming the air 255.

The air 255 in the second air hole 215c is injected into an inner space 180, becoming air 256.

The air 256 in the inner space 180 is transported between a space between the display panel 140 and the touch screen panel 150, as shown in FIG. 5. Thus, a pressure of the air 256 in the inner space 180, e.g., interposed between the display panel 140 and the touch screen panel 150, is increased to be substantially equal to the pressure of the air 251 at the exterior of the display device.

Conversely, when the pressure of the air 256 in the inner space 180, e.g., between the display panel 140 and the touch screen panel 150, is greater than the pressure of the air 251 at the exterior of the display device, the air 256 interposed between the display panel 140 and the touch screen panel 150 flows from the inner space 180 through the second air hole 215c, the expansion space 215b and the first air hole 215a, sequentially, e.g., toward the exterior of the display device.

Thus, in the method of compensating for pressure changes of the display device according to the fourth exemplary embodiment of the present invention in FIG. 5, a pressure differential between the inner space 180 and the exterior of the display device is substantially reduced or effectively eliminated. Further, the air hole 215 has the expansion space 215b, so that the particles do not flow into the inner space 180, e.g., the space between the display panel 140 and the touch screen panel 150.

Figure 6:
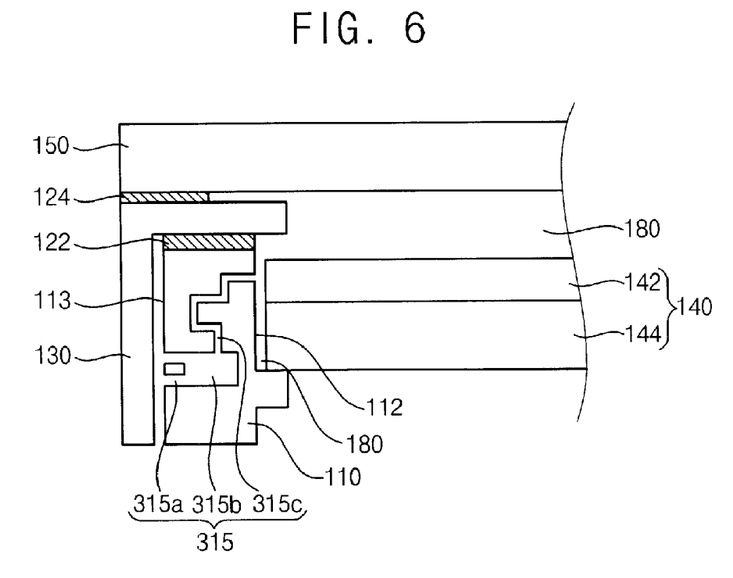
FIG. 6 is a partial cross-sectional view of a display device in accordance with a fifth exemplary embodiment of the present invention.

FIG. 6 is a partial cross-sectional view of a display device in accordance with a fifth exemplary embodiment of the present invention. The display device of FIG. 6 is substantially the same as in FIGS. 1 and 2 except for an air hole. Thus, the same reference numerals will be used to refer to the same or like parts as those described in FIGS. 1 and 2 and any repetitive explanation concerning the same or like parts will be omitted below.

Referring to FIG. 6, an air hole 315 is formed through a mold frame 110 from an inner surface 112 to an outer side surface 113 of the mold frame 110. The air hole 315 has a plurality of first air holes 315a, a second air hole 315c and an expansion space 315b.

The first air holes 315a connect the outer side surface 113 of the mold frame 110 with the expansion space 315b. The second air hole 315c connects the inner surface 112 of the mold frame 110 with the expansion space 315b.

As shown in FIG. 6, each of the first air holes 315a has a cross-sectional area substantially equal to a cross-sectional area of the second air hole 315c, and the cross-sectional area of each of the two first air holes 315a is equal to about two times the cross-sectional area of the second air hole 315c, for example, but is not limited thereto in alternate exemplary embodiments.

When an amount of the air passing through the first air holes 315a is substantially the same as that of an amount of air passing through the second air hole 315c, a velocity of the air in the first air holes 315a is less than a velocity of the air in the second air hole 315c. Thus, air flows into an inner space 180 through the second air hole 315c more rapidly than air which flows into the first air holes 315a from an exterior of the mold frame 110. Thus, a pressure of the air in the first air holes 315a is greater than a pressure of the air in the second air hole 315c.

The expansion space 315b performs substantially the same function as the expansion space 215b of the fourth exemplary embodiment of the present invention described above in reference to FIG. 5. Thus, any repetitive explanation thereof will be omitted below.

In alternative exemplary embodiments, the expansion space 315b may be omitted and the first air holes 315a may be directly connected to the second air hole 315c.

According to the display device shown in FIG. 6, the velocity of the air passing through the two first air holes 315a is less than the velocity of the air passing through the second air hole 315c, so that the pressure of the air passing through the first air holes 315a is greater than that of the air passing through the second air hole 315c. Thus, the number of particles flowing into the first air holes 315a is substantially reduced or effectively eliminated.

Figure 7:
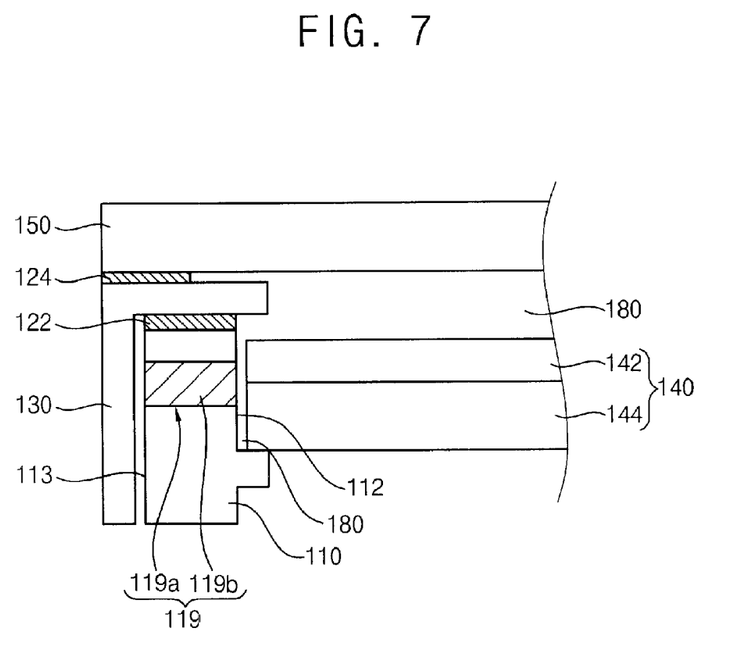
FIG. 7 is a partial cross-sectional view of a display device in accordance with a sixth exemplary embodiment of the present invention.

FIG. 7 is a partial cross-sectional view of a display device in accordance with a sixth exemplary embodiment of the present invention. The display device of FIG. 7 is substantially the same as in FIGS. 1 and 2 except for a porous venting part. Thus, the same reference numerals will be used to refer to the same or like parts as those described in FIGS. 1 and 2 and any repetitive explanation concerning the same or like parts will be omitted below.

Referring to FIG. 7, a mold frame 110 includes a porous venting part 119 formed through an inner surface 112 and an outer side surface 113 of the mold frame 110.

The porous venting part 119 includes a throughhole 119a and a porous medium 119b. The throughhole 119a is formed through the mold frame 110, and the porous medium 119b is disposed in the throughhole 119a, as shown in FIG. 7.

The porous medium 119b may include a foam resin, a porous fabric, for example, so that air may pass through the porous medium 119b. More specifically, the porous medium 119b may include Styrofoam® (extruded polystyrene or "EPS") or a similar material, or a nonwoven fabric, for example, but is not limited thereto.

In FIG. 7, the porous medium 119b functions as an air filter which blocks particles from entering an inner space 180.

A display panel 140 of the display device may include an OLED device and the porous medium 119b may further include a chemical filter such as a moisture-proof material or activated carbon, for example, but is not limited thereto.

The porous medium 119b is attached to the mold frame 110 in the throughhole 119a. In alternative exemplary embodiments, the porous medium 119b may be inserted into the throughhole 119a and be combined with the mold frame 110 through a fitting combination (not shown).

According to the display device shown in FIG. 7, the mold frame 110 includes the porous venting part 119 so that air may pass through the porous venting part 119 and particles are blocked from entering the inner space 180 by the porous venting part 119.

Figure 8:
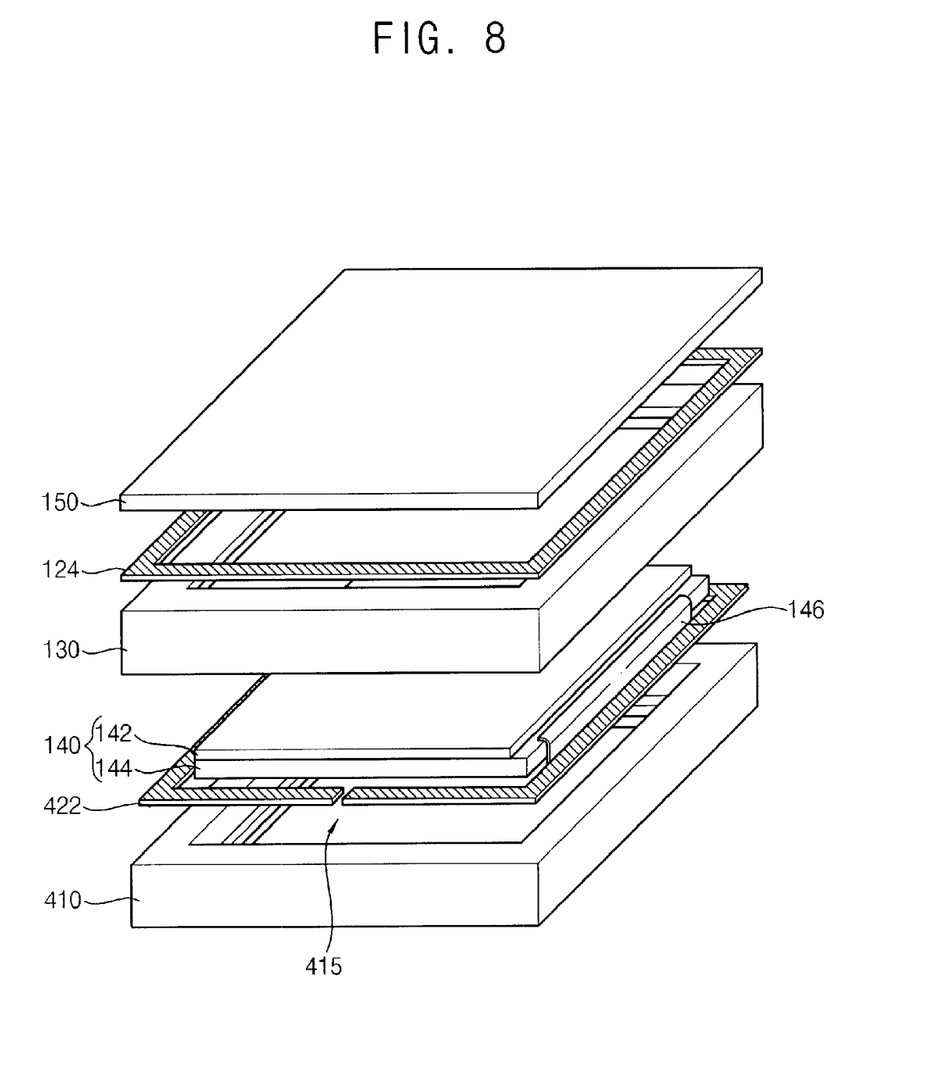
FIG. 8 is an exploded perspective view of a display device in accordance with a seventh exemplary embodiment of the present invention.

FIG. 8 is an exploded perspective view of a display device in accordance with a seventh exemplary embodiment of the present invention. The display device of FIG. 8 is substantially the same as in FIGS. 1 and 2 except for a mold frame and a first adhesive member. Thus, the same reference numerals will be used to refer to the same or like parts as those described in FIGS. 1 and 2 and any repetitive explanation concerning the same or like parts will be omitted below.

Referring to FIG. 8, the display device includes a display panel 140, a touch screen panel 150, a mold frame 410, a chassis member 130, a first adhesive member 422 and a second adhesive member 124.

The mold frame 410 receives the display panel 140, and the mold frame 110 covers a side surface of the display panel 140.

The first adhesive member 422 is interposed between the mold frame 410 and the chassis member 130 to attach the chassis member 130 to the mold frame 410.

The first adhesive member 422 has an air hole 415 so that air may flow into a space between the display panel 140 and the touch screen panel 150 or may flow out of the space between the display panel 140 and the touch screen panel 150 through the air hole 415. Thus, a pressure in an inner space of the mold frame 410 may be substantially equal to a pressure of an exterior of the display device.

A shown in FIG. 8, the air hole 415 has a linear shape. In alternative exemplary embodiments, however, the air hole 415 may have a zigzag shape or a serpentine shape, for example, but is not limited thereto.

According to the display device shown in FIG. 8, the air hole 415 transmits air so that the pressure in the space between the display panel 140 and the touch screen panel 150 is substantially equal to the pressure of the exterior of the display device.

If an air hole (not shown) is formed through the second adhesive member 124, externally provided particles may flow into the space between the display panel 140 and the touch screen panel 150. However, in FIG. 8, the air hole 415 is formed only through the first adhesive member 422 so that the number of the particles which flow into the space between the display panel 140 and the touch screen panel 150 is effectively reduced or eliminated.

Figure 9:
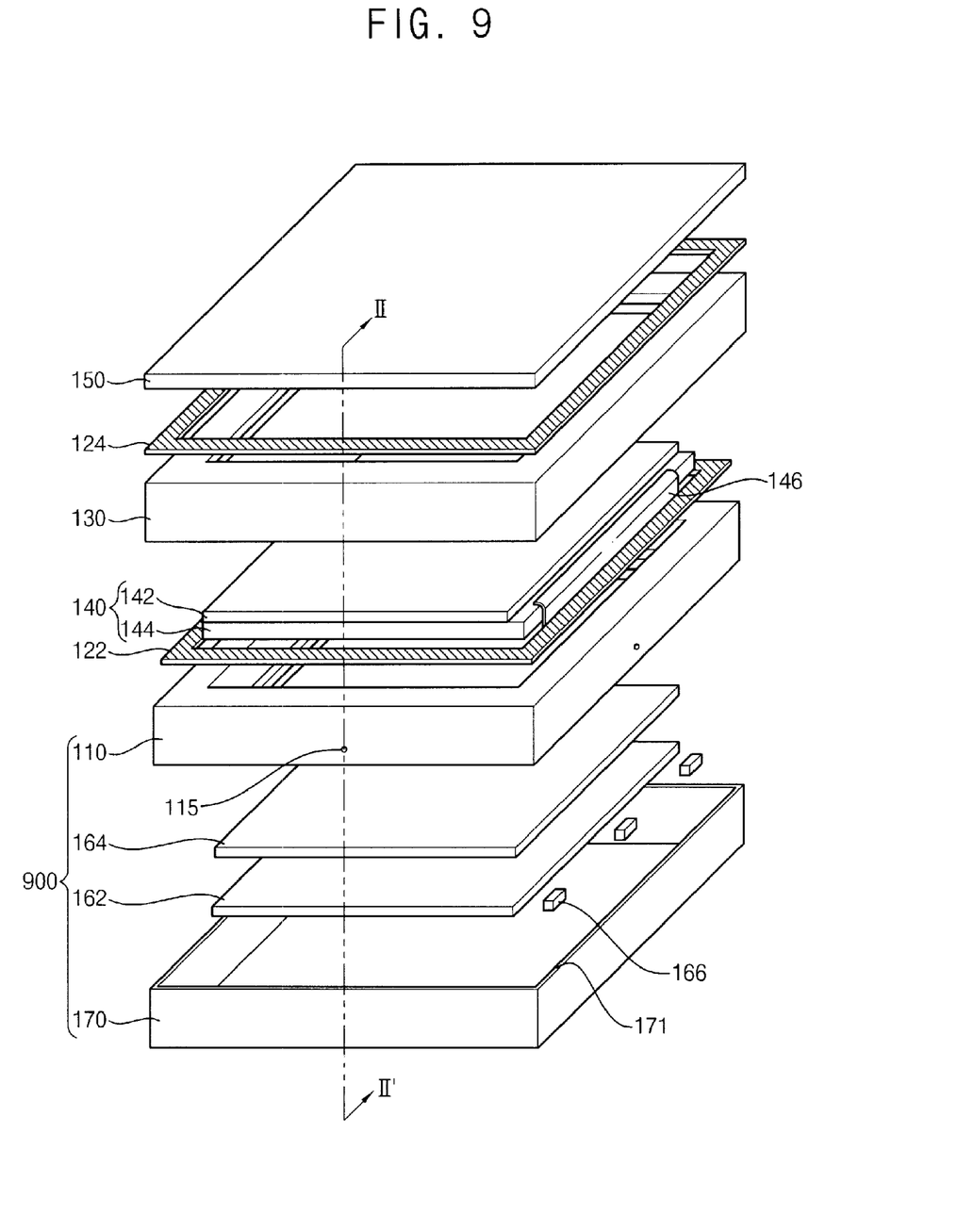
FIG. 9 is an exploded perspective view of a display device in accordance with an eighth exemplary embodiment of the present invention.
Figure 10:
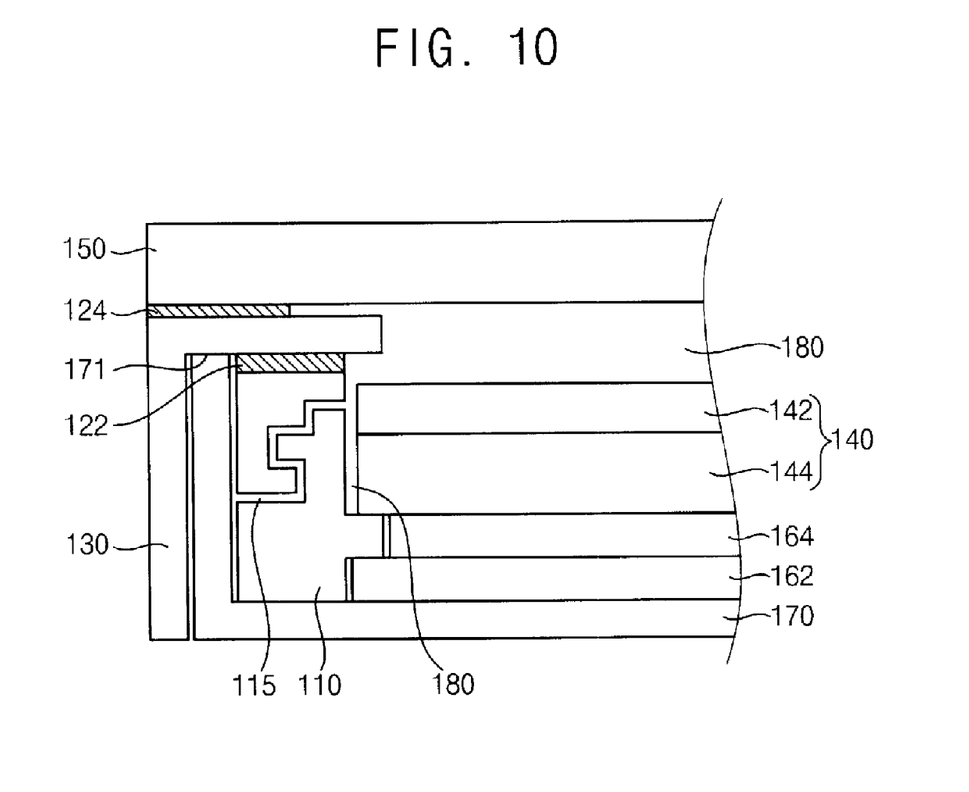
FIG. 10 is a partial cross-sectional view taken along line II-II' of the display device in accordance with the eighth exemplary embodiment of the present invention shown in FIG. 9.

FIG. 9 is an exploded perspective view of a display device in accordance with an eighth exemplary embodiment of the present invention. FIG. 10 is a partial cross-sectional view taken along line II-II' of the display device in accordance with the eighth exemplary embodiment of the present invention shown in FIG. 9. The display device of FIGS. 9 and 10 is substantially the same as in FIGS. 1 and 2 except for a light-guiding plate, an optical sheet, a light source and a bottom chassis. Thus, the same reference numerals will be used to refer to the same or like parts as those described in FIGS. 1 and 2 and any repetitive explanation concerning the same or like parts will be omitted below.

Referring to FIGS. 9 and 10, the display device according to the eight exemplary embodiment of the present invention includes a display panel 140, a touch screen panel 150, a mold frame 110, a chassis member 130, a first adhesive member 122, a second adhesive member 124, a light-guiding plate 162, an optical sheet 164, a light source 166 and a bottom chassis 170.

The bottom chassis 170 receives the mold frame 110, the light-guiding plate 162 and the light source 166, and is combined with the chassis member 130.

In FIGS. 9 and 10, a gap (not shown) may be formed between an upper surface 171 of the bottom chassis 170 and the chassis member 130 so that air may pass through the gap between the upper surface 171 of the bottom chassis 170 and the chassis member 130.

In addition, an air hole 115 is formed through the mold frame 110 so that air may pass from an exterior of the display device through the air hole 115 toward an inner space 180 between the display panel 140 and the touch screen panel 150.

Alternatively, a throughhole (not shown) may be formed through the bottom chassis 170 to transmit the air from an exterior of the display device through the air hole 115 toward an inner space 180 between the display panel 140 and the touch screen panel 150.

The light source 166 is disposed on a side surface of the light-guiding plate 162 to supply the light-guiding plate 162 with light. In FIGS. 9 and 10, the light source 166 includes a light-emitting diode ("LED"). In alternative exemplary embodiments, the light source 166 may include a cold cathode fluorescent lamp ("CCFL") or an external electrode fluorescent lamp ("EEFL"), for example, but is not limited thereto.

The light-guiding plate 162 guides the light toward the optical sheet 164.

The optical sheet 164 is interposed between the light-guiding plate 162 and the display panel 140 to improve optical characteristics of light emitted from the light-guiding plate 162. For example, the optical sheet 164 may improve luminance uniformity and/or a luminance level for a given direction of light travel.

The display panel 140 displays an image using the light which passes through the optical sheet 164.

The bottom chassis 170, the light-guiding plate 162, the optical sheet 164, the light source 166 and the mold frame 110 form a backlight assembly 900.

In FIGS. 9 and 10, the display device includes an edge illumination type backlight assembly. In alternative exemplary embodiments, the display device may include a direct illumination type backlight assembly, for example, but is not limited thereto.

According to exemplary embodiments of the present invention as described herein, a space between a display panel and a touch screen panel is connected to an exterior of a display device through an air hole so that a pressure of the space between the display panel and the touch screen panel may be substantially equal to a pressure of the exterior of the display device. Thus, a pressure difference between the space between the display panel and the touch screen panel and the exterior of the display device is effectively reduced or eliminated, thereby preventing the touch screen panel from bending toward the display panel. Thus, an image display quality of the display device is improved.

The present invention should not be construed as being limited to the exemplary embodiments set forth herein. Rather, these exemplary embodiments are provided so that this disclosure will be thorough and complete and will fully convey the concept of the present invention to those skilled in the art.

For example, the air hole may have a zigzag shape or a serpentine shape, for example, but is not limited thereto, thereby preventing particles from flowing into the space between the display panel and the touch screen panel.

Furthermore, the air hole may have first air holes, a second air hole and an expansion space, thereby preventing the particles from flowing into the space between the display panel and the touch screen panel.

In addition, the mold frame may include a porous venting part to transmit air, thereby blocking the particles.

Also, the air hole may be formed through an adhesive member to simplify a manufacturing process of the display device.

While the present invention has been particularly shown and described with reference to exemplary embodiments thereof, it will be understood by those having ordinary skill in the art that various changes in form and details may be made therein without departing from the spirit and scope of the present invention as defined by the following claims.

What is claimed is:

1. A display device comprising:
a display panel which displays an image;
a touch screen panel disposed above the display panel; and
a receiving container including a mold frame which has an upper surface facing a lower surface of the touch screen panel, and receives and supports the display panel and has a venting part extending therethrough and having an entrance formed at an inner side surface of the mold frame to adjust a pressure of a space between the display panel and the touch screen panel which is in direct fluid communication with an external space.

2. The display device of claim 1, wherein the venting part has an air hole formed through the mold frame, the air hole extending from the inner side surface to an outer side surface of the mold frame.

3. The display device of claim 2, wherein the air hole has a zigzag shape.

4. The display device of claim 2, wherein the air hole has a serpentine shape.

5. The display device of claim 1, wherein the venting part has an air hole formed through the mold frame, the air hole extending from the inner side surface toward a lower bottom surface of the mold frame.

6. The display device of claim 5, wherein the air hole comprises:
a first straight portion extending from an opening at the inner side surface of the mold frame in a first direction substantially toward an outer side surface of the mold frame;
a first bent portion connecting the first straight portion to a second straight portion, the second straight portion extending from the first bent portion in a second direction substantially perpendicular to the first direction downward toward the bottom surface of the mold frame;
a second bent portion connecting the second straight portion to a third straight portion, the third straight portion extending from the second bent portion in the first direction;
a third bent portion connecting the third straight portion to a fourth straight portion, the fourth straight portion extending from the third bent portion in the second direction;
a fourth bent portion connecting the fourth straight portion to a fifth straight portion, the fifth straight portion extending from the fourth bent portion in a third direction substantially opposite to the first direction; and
a fifth bent portion connecting the fifth straight portion to a sixth straight portion, the sixth straight portion extending from the fifth bent portion in the second direction to an opening at the bottom surface of the mold frame.

7. The display device of claim 5, wherein the air hole has a serpentine shape.

8. The display device of claim 1, wherein the venting part comprises:
an expansion space formed in the mold frame;
a first air hole formed from the expansion space to an outer side surface of the mold frame; and
a second air hole formed from the expansion space to an inner side surface of the mold frame.

9. The display device of claim 8, wherein a width of the expansion space is greater than a width of the first air hole and a width of the second air hole.

10. The display device of claim 8, wherein the venting part further comprises a plurality of first air holes.

11. The display device of claim 1, wherein the venting part further comprises a porous venting portion formed through the mold frame from an inner side surface of the mold frame to an outer side surface of the mold frame.

12. The display device of claim 11, wherein the porous venting part further comprises a foam resin or a porous fabric.

13. The display device of claim 1, wherein the receiving container further comprises:
a mold frame which supports the display panel;
a chassis member on the mold frame to support the touch screen panel;
a first adhesive member interposed between the mold frame and the chassis member; and
a second adhesive member interposed between the chassis member and the touch screen panel.

14. The display device of claim 13, wherein the venting part comprises an air hole formed through the first adhesive member between the mold frame and the chassis member.

15. The display device of claim 1, further comprising:
a backlight assembly disposed under the display panel to supply the display panel with light; and
a bottom chassis combined with the receiving container to receive the backlight assembly.

* * * * *